(12) United States Patent
Chen

(10) Patent No.: US 12,009,334 B2
(45) Date of Patent: Jun. 11, 2024

(54) INSULATING PASTE-BASED CONDUCTIVE DEVICE AND MANUFACTURING METHOD THEREOF

(71) Applicant: Shenzhen Guangshe Zhaoming Technology Co., LTD, Shenzhen (CN)

(72) Inventor: Jianwei Chen, Shenzhen (CN)

(73) Assignee: Shenzhen Guangshe Zhaoming Technology Co., LTD, Shenzhen (CN)

(*) Notice: Subject to any disclaimer, the term of this patent is extended or adjusted under 35 U.S.C. 154(b) by 210 days.

(21) Appl. No.: 17/721,418

(22) Filed: Apr. 15, 2022

(65) Prior Publication Data
US 2023/0307408 A1    Sep. 28, 2023

(30) Foreign Application Priority Data

Mar. 24, 2022    (CN) .......................... 202210297900.1

(51) Int. Cl.
*H01L 23/00* (2006.01)
*H05K 1/14* (2006.01)
*H05K 3/36* (2006.01)

(52) U.S. Cl.
CPC .............. *H01L 24/32* (2013.01); *H01L 24/29* (2013.01); *H01L 24/83* (2013.01); *H05K 1/144* (2013.01);
(Continued)

(58) Field of Classification Search
CPC . H01L 2224/05624; H01L 2224/05639; H01L 2224/05644; H01L 2224/05647; H01L 2224/05686; H01L 2224/05693; H01L 2224/2919; H01L 2224/32145; H01L 2224/32227; H01L 2224/83201; H01L 2224/83862; H01L 23/00; H01L 24/05; H01L 24/29; H01L 24/31; H01L 24/32;
(Continued)

(56) References Cited

U.S. PATENT DOCUMENTS

| 2012/0205816 A1* | 8/2012 | Son | H01L 23/293 |
| | | | 257/774 |
| 2014/0144677 A1* | 5/2014 | Wang | H05K 1/0206 |
| | | | 174/252 |
| 2020/0105696 A1* | 4/2020 | Cheng | H01L 24/11 |

FOREIGN PATENT DOCUMENTS

| CN | 204045356 U | 12/2014 | |
| CN | 110336576 A | 10/2019 | |
| CN | 110875202 B | * 11/2021 | ............. H01L 21/18 |

* cited by examiner

*Primary Examiner* — Timothy J Thompson
*Assistant Examiner* — Guillermo J Egoavil

(57) ABSTRACT

Provided are an insulating paste-based conductive device and a manufacturing method thereof. The device comprises a first substrate and a second substrate arranged relative to the first substrate, and further comprises at least one first electrode disposed below the first substrate, a second electrode disposed on the second substrate and corresponding to the first electrode, and an insulating paste coating disposed on a contact surface between the first electrode and the second electrode, the insulating paste coating being electrically connected with the first electrode and the corresponding second electrode. The invention has good universality, such that the requirements of implementing or applying the art on a ceramic circuit board, a metal-based circuit board, an epoxy glass fiber circuit board, a flexible printed circuit board and a glass circuit board can be set, and an electronic circuit board without a packaging element on the circuit boards above can also be manufactured.

5 Claims, 3 Drawing Sheets

(52) U.S. Cl.
CPC .............. *H05K 3/368* (2013.01); *H01L 24/05* (2013.01); *H01L 2224/05624* (2013.01); *H01L 2224/05639* (2013.01); *H01L 2224/05644* (2013.01); *H01L 2224/05647* (2013.01); *H01L 2224/05686* (2013.01); *H01L 2224/05693* (2013.01); *H01L 2224/2919* (2013.01); *H01L 2224/32145* (2013.01); *H01L 2224/32227* (2013.01); *H01L 2224/83201* (2013.01); *H01L 2224/83862* (2013.01); *H01L 2924/0549* (2013.01); *H01L 2924/12041* (2013.01)

(58) Field of Classification Search
CPC ............. H01L 24/83; H01L 2924/0549; H01L 2924/12041; H05K 1/144; H05K 1/14; H05K 3/321; H05K 3/368; H05K 3/36; H05K 174/257
USPC ........................................................ 174/257
See application file for complete search history.

INSULATING PASTE-BASED CONDUCTIVE DEVICE AND MANUFACTURING METHOD THEREOF

CROSS REFERENCE TO RELATED APPLICATIONS

This application claims foreign priority of Chinese Patent Application No. 202210297900.1, filed on Mar. 24, 2022 in the China National Intellectual Property Administration, the disclosures of all of which are hereby incorporated by reference.

TECHNICAL FIELD

The present invention relates to the field of basic conductive technologies of quantum technologies of electronic technologies, and more particularly, to an insulating paste-based conductive device and a manufacturing method thereof.

BACKGROUND

Chinese patent application No. CN2015103045761, titled as "LED FLIP CHIP SOLID CRYSTAL CONDUCTIVE ADHESIVE STRUCTURE AND MOUNTING METHOD THEREFOR", discloses the conductive adhesive connection of only two pairs of LED flip chip metal electrodes. However, the patent has single sizing object and method, and does not propose an application in nonmetal and transparent electrodes.

Experiments have proved that in an insulating paste conductive technology, a number of electrodes or electrode pairs directly affects a conductivity of electrode, which means that the greater the number of electrodes or electrode pairs is, the lower the conductivity is. Chinese patent application No. CN2015103045761 only solves two pairs of electrodes, and there are still technical obstacles when there are more electrodes or electrode pairs.

Therefore, an insulating paste-based conductive device and a manufacturing method thereof are proposed.

SUMMARY

The present invention aims to provide an insulating paste-based conductive device with integrated electric conduction, light conduction and heat conduction performances and a manufacturing method thereof.

The present invention provides an insulating paste-based conductive device, which comprises a first substrate and a second substrate arranged relative to the first substrate, and further comprises at least one first electrode disposed below the first substrate, a second electrode disposed on the second substrate and corresponding to the first electrode, and an insulating paste coating disposed on a contact surface between the first electrode and the second electrode, wherein the insulating paste coating is electrically connected with the first electrode and the corresponding second electrode.

Preferably, a plurality of first electrodes arranged in an array are provided, a plurality of second electrodes arranged in an array are provided, the insulating paste coating disposed between the first electrode and the second electrode corresponding to the first electrode is linear, and the insulating paste coating disposed between the first substrate and the second substrate, and disposed between the adjacent first electrodes and the adjacent second electrodes is annular.

Preferably, the insulating paste coating is a thermosetting adhesive.

Preferably, the insulating paste coating has a nanometer thickness.

Preferably, the first electrode and the second electrode are non-transparent electrodes, specifically comprising copper electrodes, gold electrodes, silver electrodes, alloy electrodes, silver-burned electrodes, elargol electrodes or carbon electrodes.

Preferably, the first electrode and the second electrode are transparent electrodes, specifically comprising nano-silver electrodes, nano-aluminum electrodes, nano-copper electrodes or ITO electrodes.

The present invention further provides a manufacturing method of the insulating paste-based conductive device, which comprises the following steps of:

S1: sizing a lower surface of the first electrode and/or an upper surface of the second electrode;

S2: applying a pressure to the first substrate and/or the second substrate, so that the first electrode and the second electrode are conductively adhered; and S3: heating and curing the first substrate and the second substrate to form the insulating paste coating on the contact surface between the first electrode and the second electrode, wherein the insulating paste coating realizes electrical connection between the first electrode and the corresponding second electrode.

Preferably, a method of sizing in step S1 is adhesive spraying or adhesive dispensing.

Preferably, the curing in step S3 is carried out at a heating temperature of 100° C. to 170° C., and the heating lasts for 60 minutes to 90 minutes.

Preferably, in step S3, a curing pressure is applied to the upper surface of the first substrate and/or the lower surface of the second substrate.

The present invention has good universality, such that the requirements of implementing or applying the art on a ceramic circuit board, a metal-based circuit board, an epoxy glass fiber circuit board, a flexible printed circuit board, a glass circuit board and a transparent circuit board can be set, and an electronic circuit board without a packaging element on the circuit boards above can also be manufactured.

Figure 1:
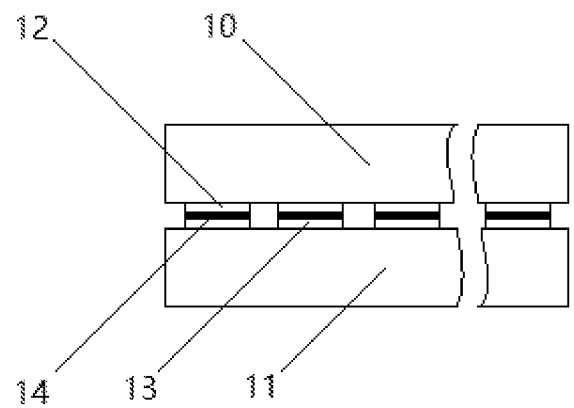
FIG. 1 is a schematic structural diagram of an insulating paste-based conductive device according to an embodiment of the present invention.

Reference numerals: 10 refers to first substrate; 11 refers to second substrate; 12 refers to first electrode; 13 refers to second electrode; and 14 refers to insulating paste coating.

DETAILED DESCRIPTION

To make the objects, the technical solutions and the advantages of the present invention clearer, the present invention is further described in detail hereinafter with reference to the drawings and the embodiments. It should be understood that the specific embodiments described herein are only used for explaining the present invention, and are not intended to limit the present invention.

As shown in FIG. 1 to FIG. 4, an insulating paste-based conductive device according to the present invention comprises a first substrate 10, a second substrate 11 arranged relative to the first substrate 10, a plurality of first electrodes 12 disposed below the first substrate 10 and arranged in an array, a plurality of second electrodes 13 disposed on the second substrate 11 and arranged in an array, and an insulating paste coating 14 disposed on a contact surface between the first electrode 12 and the second electrode 13. The insulating paste coating 14 is electrically connected with the first electrode 12 and the corresponding second electrode 13.

In other embodiments, there may also be only one first electrode and one second electrode, and the first electrode and the second electrode are respectively laid on the first substrate 10 and the second substrate 11 by whole surfaces, so as to be suitable for some special occasions.

The insulating paste coating 14 is a thermosetting adhesive, which may be a phenolic resin, an amino resin and an epoxy resin.

The insulating paste coating 14 has a nanometer thickness.

The first electrode 12 and the second electrode 13 are metal or nonmetal conductive electrodes. According to a light transmission performance, the first electrode 12 and the second electrode 13 may be divided into transparent and non-transparent electrodes. Taking the classification by the light transmission performance as an example, the non-transparent electrodes comprise copper electrodes, gold electrodes, silver electrodes, alloy electrodes, silver-burned electrodes, elargol electrodes and carbon electrodes (the electrodes are the nonmetal electrodes). The transparent electrodes comprise nano-silver electrodes, nano-aluminum electrodes, nano-copper electrodes and ITO electrodes (the electrodes are the metal electrodes).

The lower surface of the first electrode 12 and/or the upper surface of the second electrode 13 are rough or non-rough surfaces, which is beneficial for electric conduction between the first electrode 12 and the second electrode 13.

The lower surface of the first electrode 12 and/or the upper surface of the second electrode 13 is sized (a method of sizing is adhesive spraying or adhesive dispensing), the first substrate 10 and/or the second substrate 11 is applied with an adhering pressure, so that the first electrode 12 and the second electrode 13 are electrically adhered, and then the first substrate 10 and the second substrate 11 are heated and cured to form the insulating paste coating 14 on the contact surface between the first electrode 12 and the second electrode 13. The insulating paste coating 14 has the thickness of nanoscale. The insulating paste coating 14 does not contain any conductive medium.

From a cross-sectional view, the insulating paste coating 14 disposed between the first electrode 12 and the second electrode 13 corresponding to the first electrode 12 is linear, and the insulating paste coating 14 disposed between the first substrate 10 and the second substrate 11, and disposed between the adjacent first electrodes 12 and the adjacent second electrodes 13 is annular. The so-called "annular" is only a protective measure to protect electrode and non-electrode parts from oxidation, corrosion and damping with the insulating paste.

When there are only one first electrode and one second electrode, the insulating paste coating disposed between the first electrode and the second electrode corresponding to the first electrode is linear.

Figure 2:
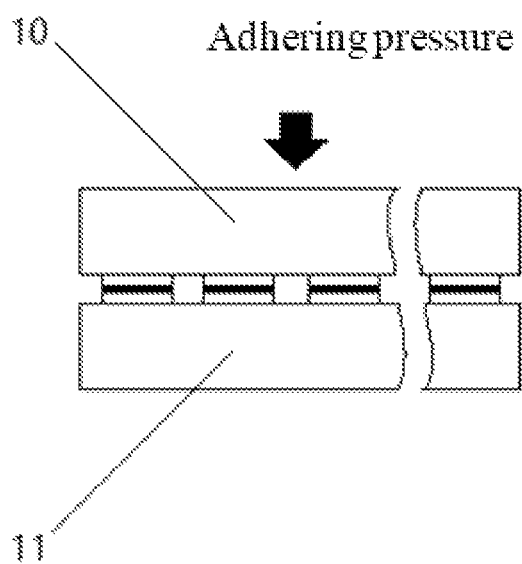
FIG. 2 is a schematic structural diagram of applying an adhering pressure on the insulating paste-based conductive device according to the embodiment of the present invention.
Figure 3:
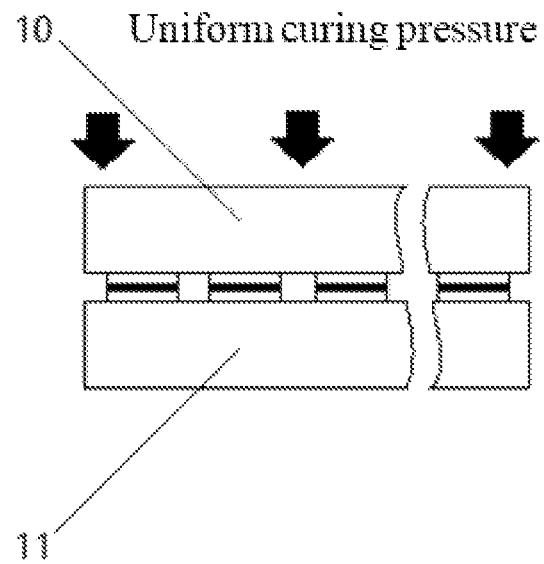
FIG. 3 is a schematic structural diagram of applying a curing pressure on the insulating paste-based conductive device according to the embodiment of the present invention.
Figure 4:
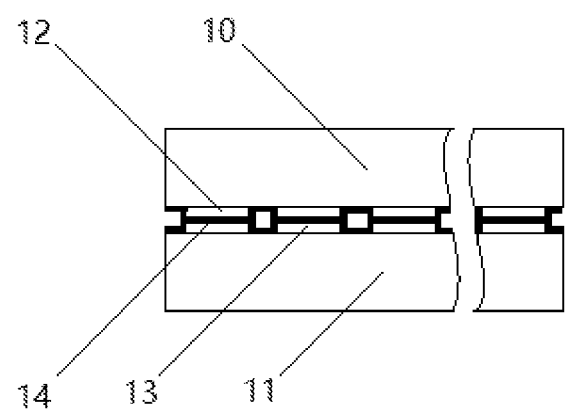
FIG. 4 is a schematic structural diagram of protecting electrodes and areas thereof with an insulating paste of the insulating paste-based conductive device according to the embodiment of the present invention.

The present invention further provides a manufacturing method of the insulating paste-based conductive device, which comprises the following steps of:

S1: as shown in FIG. 1, sizing a lower surface of the first electrode 12 and/or an upper surface of the second electrode 13 (a method of sizing is adhesive spraying or adhesive dispensing);

S2: as shown in FIG. 2, applying an adhering pressure to the first substrate 10 and/or the second substrate 11, so that the first electrode 12 and the second electrode 13 are conductively adhered; and S3: as shown in FIG. 3, heating and curing the first substrate 10 and the second substrate 11 to form the insulating paste coating 14 on the contact surface between the first electrode 12 and the second electrode 13, wherein the insulating paste coating 14 realizes electrical connection between the first electrode 12 and the corresponding second electrode 13.

A method of curing is heating the first substrate 10 and the second substrate 11 in an oven for curing at a heating temperature of 100° C. to 170° C., and the heating lasts for 60 minutes to 90 minutes.

In step S3, a curing pressure is applied to the upper surface of the first substrate 10 and/or the lower surface of the second substrate 11, so as to improve a conductivity between multiple pairs of electrodes.

Figure 5:
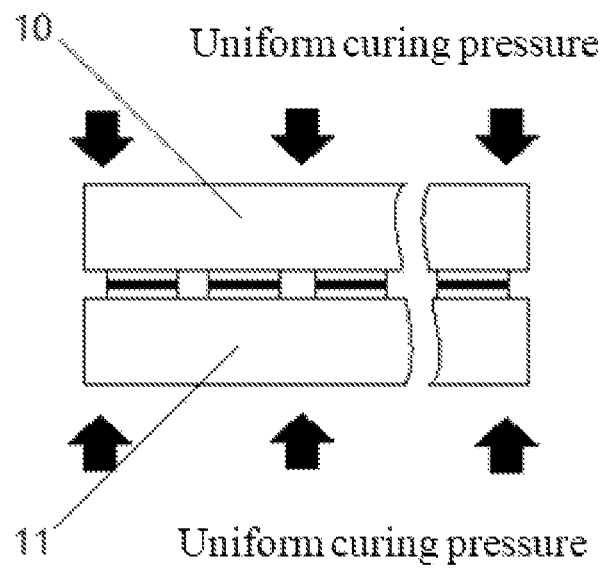
FIG. 5 is another schematic structural diagram of applying the curing pressure on the insulating paste-based conductive device according to the embodiment of the present invention.

FIG. 5 is another schematic structural diagram of applying the curing pressure on the insulating paste-based conductive device according to the embodiment of the present invention, wherein the curing pressure is simultaneously applied to the upper surface of the first substrate 10 and the lower surface of the second substrate 11.

Figure 6:
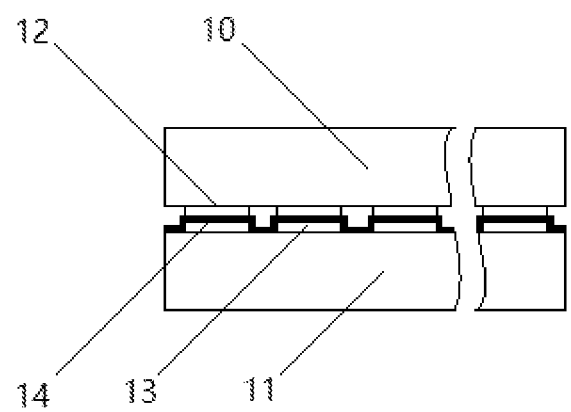
FIG. 6 is another schematic structural diagram of protecting the electrodes and the areas thereof with the insulating paste of the insulating paste-based conductive device according to the embodiment of the present invention.

FIG. 6 is another schematic structural diagram of protecting the electrodes and the areas thereof with the insulating paste of the insulating paste-based conductive device according to the embodiment of the present invention, which is an effect diagram after only the second substrate 11 is subjected to adhesive dispensing or adhesive spraying.

A principle of the present invention refers to a tunneling effect.

The insulating paste coating of the present invention can protect the electrodes from oxidation, damping and corrosion.

According to the present invention, conductive adhesive connection of insulating paste may be carried out on a non-rough electrode surface.

The present invention may be used in anti-electromagnetic interference, small-pitch LED screens, micron LED chips, semiconductor technologies, bioelectronics, light therapy and mobile phones.

The insulating paste coating conductive technology of the present invention has integrated electric conduction, light conduction and heat conduction performances, and may be used in metamaterials, aerospace, radars, solar power generation and optical quantum communication.

The present invention has a good universality, can meet the requirements of implementing or applying the art on a ceramic circuit board, a metal-based circuit board, an epoxy glass fiber circuit board, a flexible printed circuit board, a glass circuit board and a transparent circuit board, and can also manufacture an electronic circuit board without a packaging element on the circuit boards above.

The description above is only the preferred embodiments of the present invention, and is not intended to limit the present invention in any form. Although the present invention has been disclosed by the preferred embodiments above, the preferred embodiments are not intended to limit the present invention. Those skilled in the art can make some changes or modifications as equivalent embodiments with equivalent changes by using the technical contents disclosed above without departing from the scope of the technical solutions of the present invention. However, for the contents not departing from the scope of the technical solutions of the present invention, any simple amendments, equivalent changes and modifications made to the above embodiments according to the technical essence of the present invention are still included in the scope of the technical solutions of the present invention.

The invention claimed is:

1. An insulating paste-based conductive device, comprising a first substrate and a second substrate arranged relative to the first substrate, and further comprising at least one first electrode disposed below the first substrate, a second electrode disposed on the second substrate and corresponding to the first electrode, and an insulating paste coating disposed on a contact surface between the first electrode and the second electrode, wherein the insulating paste coating is electrically connected with the first electrode and the corresponding second electrode;
where, the insulating paste coating has a nanometer thickness.

2. The insulating paste-based conductive device according to claim 1, wherein a plurality of first electrodes arranged in an array are provided, and a plurality of second electrodes arranged in an array are also provided relative to the first electrodes.

3. The insulating paste-based conductive device according to claim 1, wherein the insulating paste coating is a thermosetting adhesive.

4. The insulating paste-based conductive device according to claim 1, wherein the first electrode and the second electrode are non-transparent electrodes, specifically comprising copper electrodes, gold electrodes, silver electrodes, alloy electrodes, silver-burned electrodes, elargol electrodes or carbon electrodes.

5. The insulating paste-based conductive device according to claim 1, wherein the first electrode and the second electrodeare transparent electrodes, specifically comprising nano-silver electrodes, nano-aluminum electrodes, nano-copper electrodes or ITO electrodes.

* * * * *